(12) United States Patent
Yang et al.

(10) Patent No.: US 11,424,348 B2
(45) Date of Patent: Aug. 23, 2022

(54) DISPLAY PANEL PREPARATION METHOD AND DISPLAY PANEL

(71) Applicant: HKC CORPORATION LIMITED, Shenzhen (CN)

(72) Inventors: Fengyun Yang, Chongqing (CN); En-Tsung Cho, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 735 days.

(21) Appl. No.: 16/327,306

(22) PCT Filed: Nov. 15, 2018

(86) PCT No.: PCT/CN2018/115610
§ 371 (c)(1),
(2) Date: Feb. 21, 2019

(87) PCT Pub. No.: WO2020/082460
PCT Pub. Date: Apr. 30, 2020

(65) Prior Publication Data
US 2021/0359112 A1    Nov. 18, 2021

(30) Foreign Application Priority Data
Oct. 22, 2018    (CN) .......................... 201811230494.7

(51) Int. Cl.
*H01L 29/66*    (2006.01)
*H01L 29/40*    (2006.01)
(Continued)

(52) U.S. Cl.
CPC ...... *H01L 29/66969* (2013.01); *H01L 29/401* (2013.01); *H01L 29/7869* (2013.01);
(Continued)

(58) Field of Classification Search
CPC ........... H01L 29/66969; H01L 29/7869; H01L 29/401; H01L 29/78633; G02F 1/136236; G02F 1/136209; G02F 1/13685
See application file for complete search history.

(56) References Cited

U.S. PATENT DOCUMENTS 9,812,585 B2 * 11/2017 Yamazaki ............. H01L 29/045
10,439,068 B2 * 10/2019 Shimomura ........ H01L 27/1225
(Continued)

FOREIGN PATENT DOCUMENTS

CN    102683208 A    9/2012
CN    103050626 A    4/2013
(Continued)

OTHER PUBLICATIONS

International Search Report issued in corresponding International application No. PCT/CN2018/115610, dated Jul. 26, 2019.
(Continued)

*Primary Examiner* — Jonathan Han (57) ABSTRACT

The present application discloses a display panel preparation method and a display panel. The display panel preparation method includes: forming a first metal layer, a buffer layer, an oxide film layer, and a gate insulating layer on a substrate; and etching on a second layer of metal by using a same mask process, to obtain a gate layer, a source layer, and a drain layer.

19 Claims, 7 Drawing Sheets

(51) Int. Cl.
H01L 29/786 (2006.01)
*G02F 1/1368* (2006.01)
*G02F 1/1362* (2006.01)

(52) U.S. Cl.
CPC .... *G02F 1/13685* (2021.01); *G02F 1/136209* (2013.01); *G02F 1/136236* (2021.01); *H01L 29/78633* (2013.01)

(56) References Cited

U.S. PATENT DOCUMENTS

2015/0214373 A1*  7/2015  Zhang .............. H01L 29/41733
                                                257/72
2015/0333182 A1* 11/2015  Guo ................ H01L 27/1288
                                                257/43
2018/0097119 A1*  4/2018  Shan ................ H01L 29/66484

FOREIGN PATENT DOCUMENTS

| CN | 103219391 A | 7/2013 |
| CN | 106298883 A | 1/2017 |
| CN | 109585297 A | 4/2019 |
| JP | 4887646 B2  | 2/2012 |

OTHER PUBLICATIONS

Written Opinion of the International Searching Authority for No. PCT/CN2018/115610.
First Office Action from China patent office in a counterpart Chinese patent Application 201811230494.7, dated Dec. 9, 2019 (8 pages).
N Office Action from China patent office in a counterpart Chinese patent Application 201811230494.7, dated Apr. 15, 2020 (5 pages).

* cited by examiner

DISPLAY PANEL PREPARATION METHOD AND DISPLAY PANEL

The present application claims priority to Chinese Patent Application No. CN201811230494.7, filed with the National Intellectual Property Administration on Oct. 22, 2018 and entitled "DISPLAY PANEL PREPARATION METHOD AND DISPLAY PANEL", which is incorporated herein by reference in its entirety.

TECHNICAL FIELD

The present application relates to the field of display technologies, and in particular, to a display panel preparation method and a display panel.

BACKGROUND

The descriptions herein provide only background information related to the present application, and do not necessarily constitute the prior art.

Along with the development and advancement of technologies, the liquid crystal display becomes a main stream product of displays and is widely applied because of its advantages such as a thin body, power saving, and low radiation. Most liquid crystal displays on the market are backlight liquid crystal displays. A backlight liquid crystal display includes a liquid crystal display panel and a backlight module (backlight module). A working principle of the liquid crystal display panel is as follows: Liquid crystal molecules are placed between two parallel glass substrates, and driving voltage is applied to the two glass substrates to control a rotation direction of the liquid crystal molecules, so as to refract light of the backlight module to generate a picture.

The IGZO (indium gallium zinc oxide) technology has been widely studied and applied. There are three common IGZO structures: a BCE (back channel etched, back channel etched) structure, an ESL (etching stopper layer, etching stopper layer) structure, and a Self-aligned Top-Gate (self-aligned top-gate) structure. The BCE structure is back channel etched, and a back channel may be damaged, thereby affecting stability of a TFT component. In the ESL structure, a back channel can be protected; however, the ESL structure cannot be used as a short-channel structure, and there is relatively large parasitic capacitance. The top-gate type can be used as a short-channel structure, and there is extremely small parasitic capacitance, but one additional mask is needed.

SUMMARY

A purpose of the present application is to provide a display panel preparation method and a display panel, to reduce mask processes of the display panel.

To achieve the foregoing purpose, the present application provides a display panel preparation method, including steps of:

forming a first metal layer, a buffer layer, and an oxide film layer on a substrate in sequence;

forming a gate insulating layer on the oxide film layer by using a half-tone mask;

forming a second layer of metal on the gate insulating layer, and etching on the second layer of metal by using a same mask process, to obtain a gate layer, and a source layer and a drain layer that are connected by using the oxide film layer, and forming a passivation layer and a transparent electrode layer in sequence on the gate layer, the source layer, and the drain layer.

Optionally the steps of forming a gate insulating layer on the oxide film layer by using a half-tone mask, and forming a second layer of metal on the gate insulating layer, and etching on the second layer of metal by using a same mask process, to obtain a gate layer, and a source layer and a drain layer that are connected by using the oxide film layer include:

forming, on the oxide film layer by using the half-tone mask, a gate insulating layer that includes a middle part, a first lateral part, a second lateral part, and a hollow part, where a thickness of the middle part of the gate insulating layer is higher than thicknesses of the first lateral part and the second lateral pail, and the hollow part is separately formed between the middle part and the first lateral part and between the middle part and the second lateral part;

forming a second layer of metal on the gate insulating layer;

etching on the second layer of metal by using a same mask process, to obtain the gate layer that is located on the middle part of the gate insulating layer, and obtain the source layer that is located on the first lateral part of the gate insulating layer and the drain layer that is located on the second lateral part, where the formed source layer and drain layer are insulated from the gate layer.

Optionally, in the step of etching on the second layer of metal by using a same mask process, to obtain the gate layer that is located on the middle part of the gate insulating layer, the gate layer is located on the middle part, and a width of the gate layer is less than a width of the middle part.

Optionally, the step of forming a first metal layer, a buffer layer, and an oxide film layer on a substrate in sequence includes:

forming a first layer of metal on the substrate, and etching on the first layer of metal by using one mask, to form the first metal layer;

depositing on the first metal layer to form a buffer deposit layer, and depositing on the buffer deposit layer to form an oxide film deposit layer; and etching on the buffer deposit layer and the oxide film deposit layer by using a same mask process, to obtain the oxide film layer and the buffer layer that covers all around the first metal layer.

Optionally, the forming a first metal layer, a buffer layer, and an oxide film layer on a substrate in sequence includes:

forming a first layer of metal on the substrate, and etching on the first layer of metal by using one mask to obtain the first metal laver;

depositing on the first metal layer to form a buffer deposit layer, and depositing on the buffer deposit layer to form an oxide film deposit layer; and forming the buffer layer and the oxide film layer by using one mask, where widths of the first metal layer, the buffer layer, and the oxide film layer are equivalent.

The present application discloses a display panel preparation method, including steps of:

forming a first layer of metal on a substrate, and etching on the first layer of metal by using one mask, to form a first metal layer;

depositing on the first metal layer to form a buffer deposit layer, and depositing on the buffer deposit layer to form an oxide film deposit layer;

etching on the buffer deposit layer and the oxide film deposit layer by using a same mask process, to obtain an oxide film layer and a buffer layer that covers all around the first metal layer;

forming, on the oxide film layer by using a half-tone mask, a gate insulating layer that includes a middle part, a first lateral part, a second lateral part, and a hollow part, where a thickness of the middle part of the gate insulating layer is higher than thicknesses of the first lateral part and the second lateral part, and the hollow part is separately formed between the middle part and the first lateral part and between the middle part and the second lateral part;

forming a second layer of metal on the gate insulating layer;

etching on the second layer of metal by using a same mask process, to obtain a gate layer that is located on the middle part of the gate insulating layer, and obtain a source layer that is located on the first lateral part of the gate insulating layer and a drain layer that is located on the second lateral part, where the formed source layer and drain layer are insulated from the gate layer, and the gate layer is located on the middle part, and a width of the gate layer is less than a width of the middle part; and forming a passivation layer and a transparent electrode layer in sequence on the gate layer, the source layer, and the drain layer.

The present application further discloses a display panel, including:

a first substrate, where a first metal layer, a buffer layer, and an oxide film layer are disposed on the first substrate in sequence;

a gate insulating layer, located on the oxide film layer;

a gate layer, formed on a middle part of the gate insulating layer;

a source layer and a drain layer, formed on the gate insulating layer and located on two sides of the gate layer; and a passivation layer and a transparent electrode layer, formed in sequence on the gate layer, the source layer, and the drain layer, where the source layer and the drain layer are insulated from the gate layer, and the source layer and the drain layer are connected by using the oxide film layer, and the gate layer, the source layer, and the drain layer are formed by using a same mask process.

Optionally, the gate insulating layer includes a middle part, a first lateral part, and a second lateral part, where a thickness of the middle part is greater than thicknesses of the first lateral part and the second lateral part;

the gate insulating layer further includes a first hollow part that is formed between the middle part and the first lateral part and a second hollow part that is formed between the middle part and the second lateral part;

the gate layer is formed on the middle part;

the source layer is formed on the first lateral part and is connected to the oxide film layer by using the first hollow part;

the drain layer is formed on the second lateral part and is connected to the oxide film layer by using the second hollow part; and the gate layer, the source layer, and the drain layer are formed by using a same metal layer by using a same mask process.

Optionally, the gate layer is located on the middle part, and a width of the gate layer is less than a width of the middle part.

Optionally, two sides of the first metal layer are hollowed, and the buffer layer covers an upper surface of the first metal layer and hollowed parts on the two sides.

In this solution, a self-aligned top gate structure is improved, and the gate insulating layer is formed by using the half-tone mask. In this case, a layer of metal with which the gate insulating layer is coated through sputtering is the second layer of metal, and the gate layer, the source layer, and the drain layer can be formed at a same time through etching by using a same mask process. In this way, seven masks are changed to six masks, that is, one mask is reduced, thereby saving time of an exposing and developing process and achieving the purpose of reducing costs and improving a capacity.

BRIEF DESCRIPTION OF DRAWINGS

The drawings are included to provide further understanding of embodiments of the present application, which constitute a part of the specification and illustrate the embodiments of the present application, and describe the principles of the present application together with the text description. Apparently, the accompanying drawings in the following description show merely some embodiments of the present application, and a person of ordinary skill in the art may still derive other accompanying drawings from these accompanying drawings without creative efforts. In the accompanying drawings.

DETAILED DESCRIPTION

The specific structure and function details disclosed herein are merely representative, and are intended to describe exemplary embodiments of the present application. However, the present application can be specifically embodied in many alternative forms, and should not be interpreted to be limited to the embodiments described herein.

In the description of the present application, it should be understood that, orientation or position relationships indicated by the terms "center", "transversal", "upper", "lower", "left", "right", "vertical", "horizontal", "top", "bottom", "inner", "outer", etc. are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application. In addition, the terms such as "first" and "second" are merely for a descriptive purpose, and cannot be understood as indicating or implying relative importance, or implicitly indicating the number of the indicated technical features. Hence, the features defined by "first" and "second" can explicitly or implicitly include one or more features. In the description of the present application, "a plurality of" means two or more, unless otherwise stated. In addition, the term "include" and any variations thereof are intended to cover a non-exclusive inclusion.

In the description of the present application, it should be understood that, unless otherwise specified and defined, the terms "install", "connected with", "connected to" should be comprehended in a broad sense. For example, these terms may be comprehended as being fixedly connected, detachably connected or integrally connected; mechanically connected or electrically connected; or directly connected or indirectly connected through an intermediate medium, or in an internal communication between two elements. The specific meanings about the foregoing terms in the present application may be understood by those skilled in the art according to specific circumstances.

The terms used herein are merely for the purpose of describing the specific embodiments, and are not intended to limit the exemplary embodiments. As used herein, the singular forms "a", "an" are intended to include the plural forms as well, unless otherwise indicated in the context clearly. It will be further understood that the terms "comprise" and/or "include" used herein specify the presence of the stated features, integers, steps, operations, elements and/or components, but do not preclude the presence or addition of one or more other features, integers, steps, operations, elements, components and/or combinations thereof.

Figure 1A:
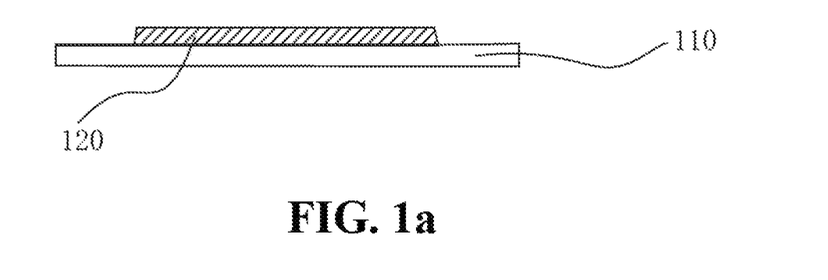
FIG. 1a to FIG. 1g are schematic diagrams of seven mask processes of a display panel according to an embodiment of the present application.

Referring to FIG. 1a, a first metal layer 120 is formed on a glass substrate 110 by using one mask process.

Figure 1B:
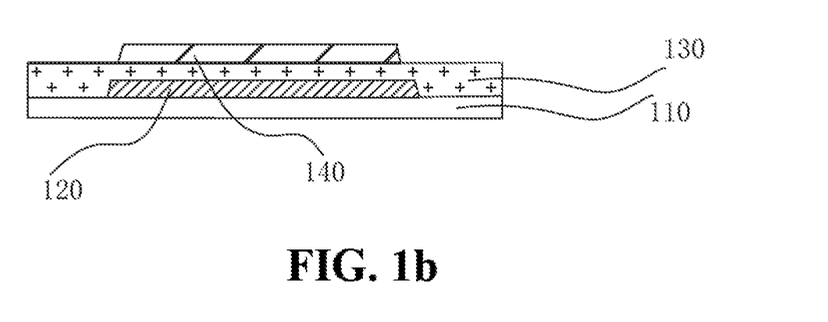

Referring to FIG. 1b, a buffer deposit layer is deposited and formed on the first metal layer 120, and an oxide film deposit layer is deposited and formed on the buffer deposit layer; and an oxide film layer 140 and a buffer layer 130 that covers around the first metal layer 120 are obtained through etching on the buffer deposit layer and the oxide film deposit layer by using a same mask process.

Figure 1C:
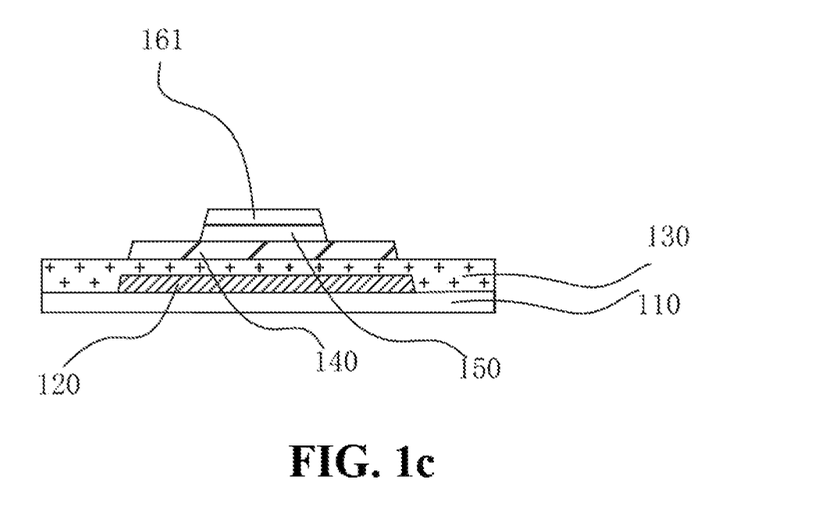

Referring to FIG. 1c, a gate insulating deposit layer is deposited and formed on the oxide film layer 140 and a gate metal layer is deposited and formed on the gate insulating deposit layer; and a gate insulating layer 150 and a gate layer 161 are formed through etching on the gate insulating deposit layer and the gate metal layer by using one mask process.

Figure 1D:
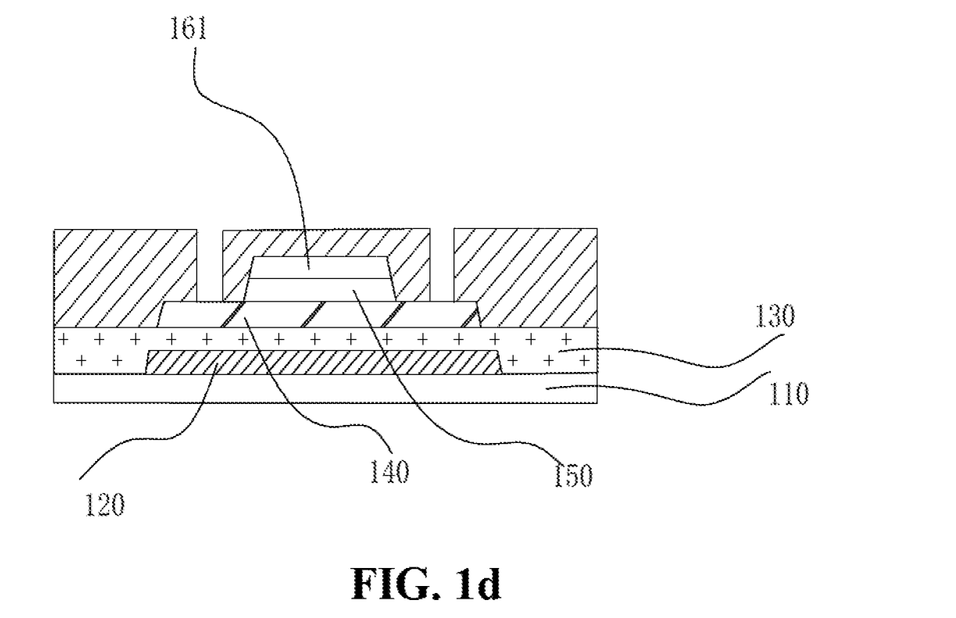

Referring to FIG. 1d, an interconnection layer that includes a middle part 151, a first lateral part 152, a second lateral part 153, and a hollow part is formed on the oxide film layer 140 by using one mask, where the hollow part is formed between the middle part 151 and the first lateral part 152 and between the middle part 151 and the second lateral part 153.

Figure 1E:
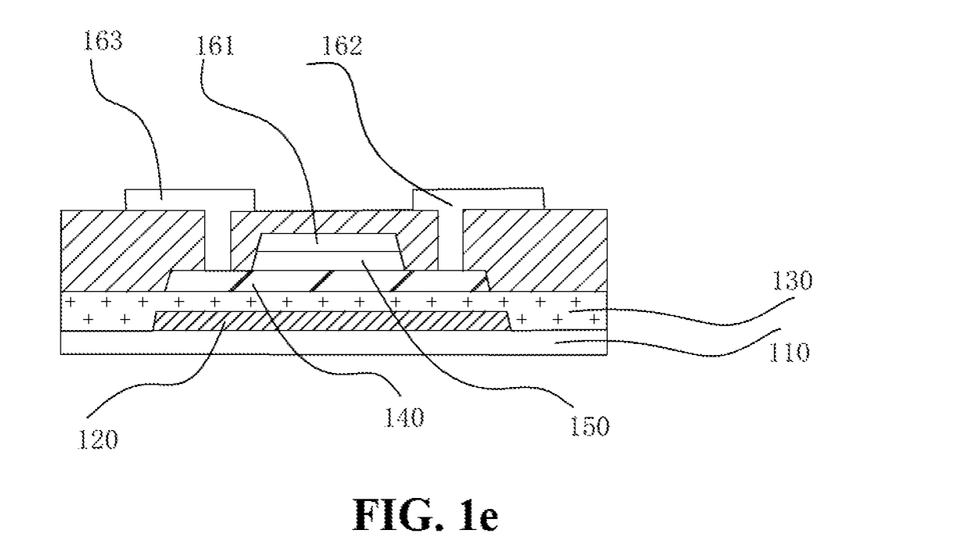

Referring to FIG. 1e, a second layer of metal is formed on the interconnection layer, and a drain layer 163 and a source layer 162 are obtained through etching on the second layer of metal by using a same mask process.

Figure 1F:
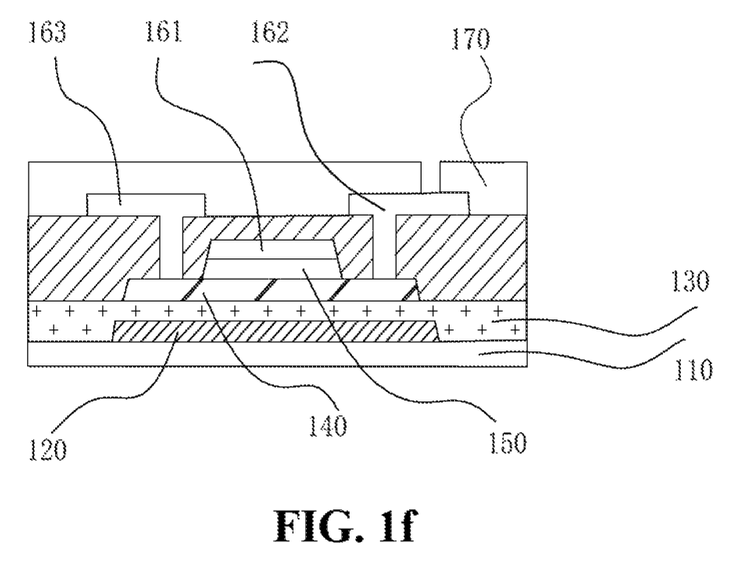

Referring to FIG. 1f, a passivation layer 170 is obtained through etching on the drain layer 163 and the source layer 162 by using one mask process.

Figure 1G:
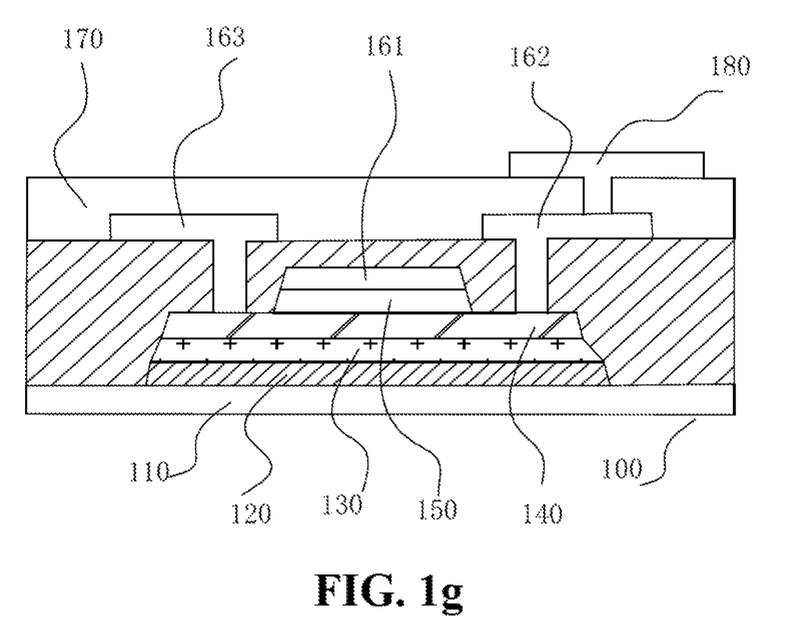

Referring to FIG. 1g, a transparent electrode layer 180 is obtained through etching on the passivation layer 170 by using one mask.
Seven masks are used in total.

The following further describes the present application with reference to accompanying drawings and embodiments.

As shown in FIG. 2a to FIG. 4, an embodiment of the present application discloses a display panel preparation method, including steps of:
forming a first metal layer 120, a buffer layer 130, and an oxide film layer 140 on a substrate 110 in sequence;
forming a gate insulating layer 150 on the oxide film layer 140 by using a half-tone mask;
forming a second layer of metal on the gate insulating layer 150, and etching on the second layer of metal by using a same mask process, to obtain a gate layer 161, and a source layer 162 and a drain layer 163 that are connected by using the oxide film layer 140; and
forming a passivation layer 170 and a transparent electrode layer 180 in sequence on the gate layer 161, the source layer 162, and the drain layer 163.

Figure 2A:
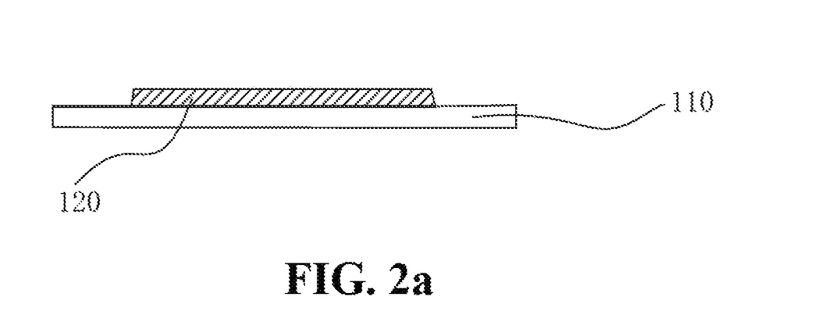
FIG. 2a to FIG. 2f are schematic diagrams of six mask processes of a display panel according to an embodiment of the present application.

The substrate 110 is a glass substrate 110.

In this solution, a self-aligned top gate structure is improved, and the gate insulating layer 150 is formed by using the half-tone mask. In this case, a layer of metal with which the gate insulating layer 150 is coated through sputtering is the second layer of metal; and the gate layer 161, the source layer 162, and the drain layer 163 can be formed at a same time through etching by using a same mask process. In this way, seven masks are changed to six masks, that is, one mask is reduced, thereby saving time of an exposing and developing process and achieving the purpose of reducing costs and improving a capacity.

Figure 2B:
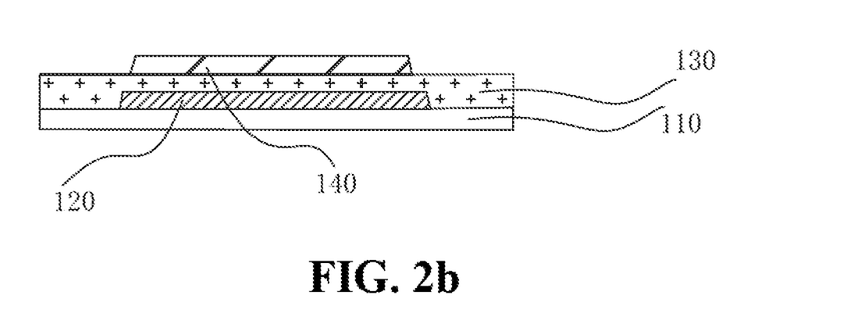
Figure 2C:
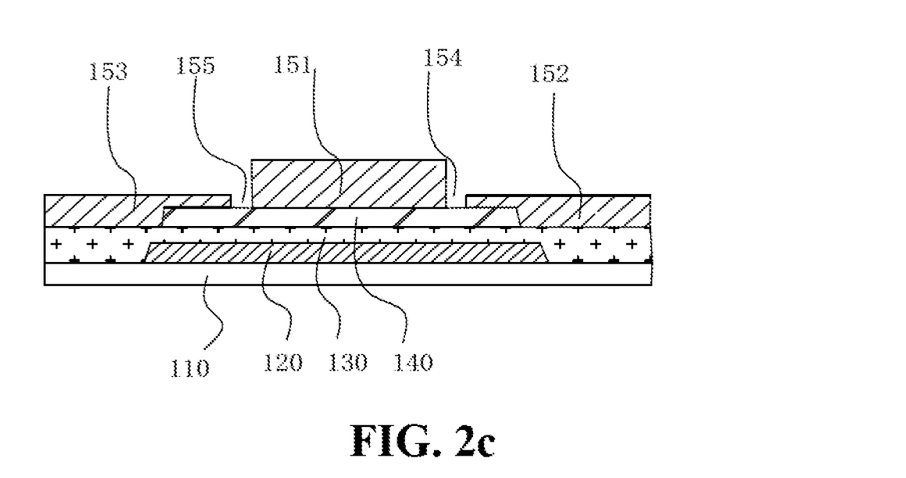
Figure 2D:
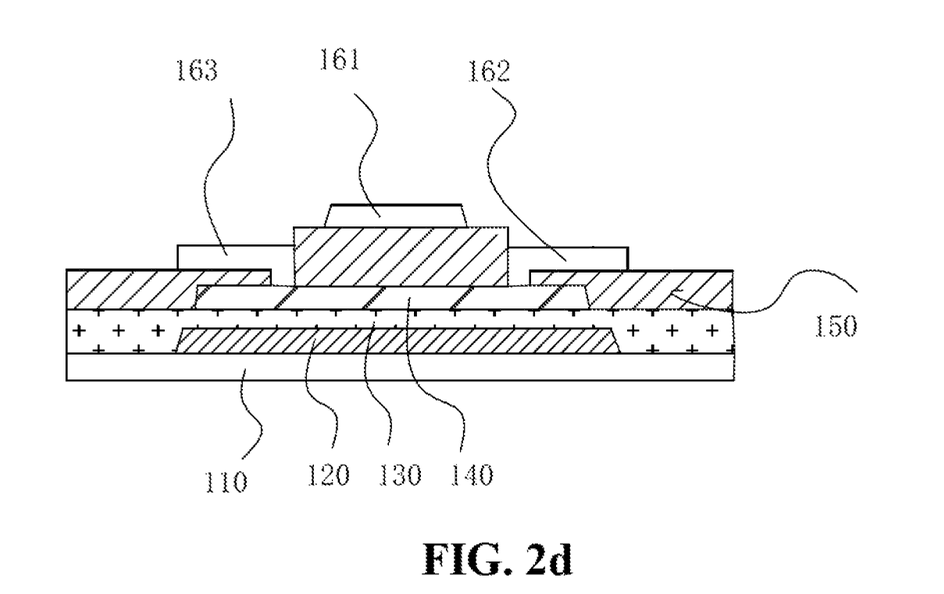
Figure 2E:
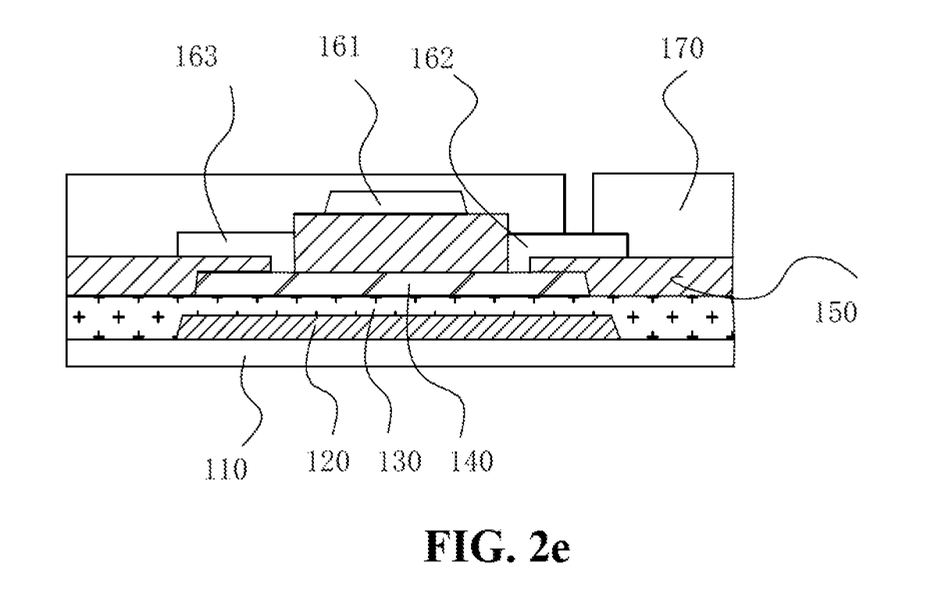

In an embodiment, referring to FIG. 2c and FIG. 2d, the steps of forming a gate insulating layer 150 on the oxide film layer 140 by using a half-tone mask, and forming a second layer of metal on the gate insulating layer 150, and etching on the second layer of metal by using a same mask process, to obtain a gate layer 161, and a source layer 162 and a drain layer 163 that are connected by using the oxide film layer 140 include:
forming, on the oxide film layer 140 by using the half-tone mask, the gate insulating layer 150 that includes a middle part 151, a first lateral part 152, a second lateral part 153, and a hollow part, where a thickness of the middle part 151 of the gate insulating layer 150 is higher than thicknesses of the first lateral part 152 and the second lateral part 153, the hollow part is separately formed between the middle part 151 and the first lateral part 152 and between the middle part 151 and the second lateral part 153, and the thicknesses of the first lateral part 152 and the second lateral part 153 are equivalent;
forming the second layer of metal on the gate insulating layer 150;
etching on the second layer of metal by using a same mask process, to obtain the gate layer 161 that is located on the middle part 151 of the gate insulating layer 150, and
obtain the source layer 162 that is located on the first lateral part 152 of the gate insulating layer 150 and the drain layer 163 that is located on the second lateral part 153, where
the formed source layer 162 and drain layer 163 are insulated from the gate layer 161.

In this solution, before the source layer 162, the gate layer 161, and the drain layer 163 are formed, the gate insulating layer 150 includes the middle part 151, the first lateral part 152, and the second lateral part 153. The thickness of the middle part 151 of the gate insulating layer 150 is higher than the thicknesses of the first lateral part 152 and the second lateral part 153. In this this way, a segment gap exists between the middle part 151 of the gate insulating layer 150 and the first lateral part 152 and between the middle part 151 of the gate insulating layer 150 and the second lateral part 153, thereby avoiding a short circuit. In addition, the hollow part is separately formed between the middle part 151 and the first lateral part 152 and between the middle part 151 and the second lateral part 153. Disposition of the hollow part can avoid a short circuit, ensure insulation, and ensure Switching performance of a TFT.

Referring to FIG. 2d, in the step of forming a second layer of metal on the gate insulating layer 150, and etching on the second layer of metal by using a same mask process, to obtain a gate layer 161 and a source layer 162 and a drain layer 163 that are connected by using the oxide film layer 140, the drain layer 163 extends from one side of the middle part 151 of the gate insulating layer 150 towards a direction away from the gate layer 161, and the source layer 162 extends from the other side of the middle part 151 of the gate insulating layer 150 towards a direction away from the gate layer 161.

In an embodiment, in the step of etching on the second layer of metal by using a same mask process, to obtain the gate layer 161 that is located on the middle part 151 of the gate insulating layer 150, the gate layer 161 is located on the middle part 151, and a width of the gate layer 161 is less than a width of the middle part 151.

In this solution, the gate layer 161 is located on the middle part 151 of the gate insulating layer 150, and the width of the gate layer 161 is less than the width of the middle part 151 of the gate insulating layer 150. The source layer 162 and the drain layer 163 are respectively located on the two lateral parts of the gate insulating layer 150. This can reduce parasitic capacitance generated between the gate layer 161 and the drain layer 163 and reduce parasitic capacitance generated between the gate layer 161 and the source layer 162.

Referring to FIG. 2b, in an embodiment, the step of forming a first metal layer 120, a buffer layer 130, and an oxide film layer 140 on a substrate 110 in sequence includes:

forming a first layer of metal on the substrate 110, and etching on the first layer of metal by using one mask, to form the first metal layer 120;

depositing on the first metal layer 120 to form a buffer deposit layer, and depositing on the buffer deposit layer to form an oxide film deposit layer; and etching on the buffer deposit layer and the oxide film deposit layer by using a same mask process, to obtain the oxide film layer 140 and the buffer layer 130 that covers all around the first metal layer 120.

In this solution, the buffer layer 130 is formed on the first metal layer 120, and the buffer layer 130 covers all around the first metal layer 120. Compared to a situation in which the buffer layer 130 does not cover the first metal layer 120 completely, the buffer layer 130 covering all around the first metal layer 120 can have a better insulation effect.

Figure 3:
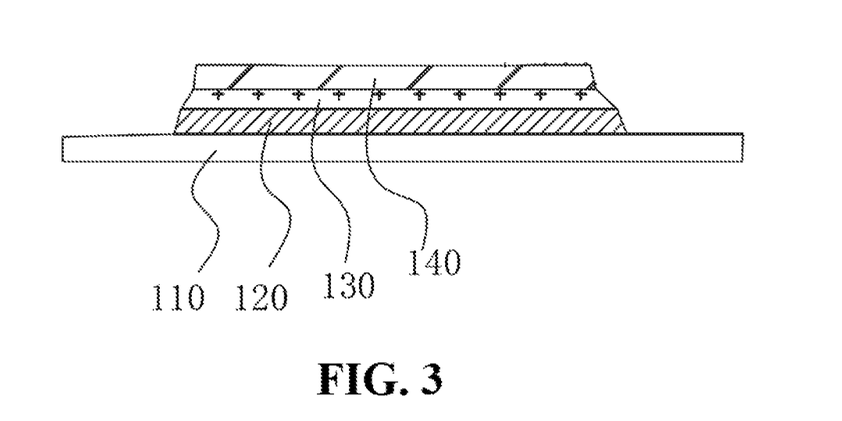
FIG. 3 is a schematic diagram (2) of six mask processes of a display panel according to an embodiment of the present application.

In an embodiment, referring to FIG. 3, the forming a first metal layer 120, a buffer layer 130, and an oxide film layer 140 on a substrate 110 in sequence includes:

forming a first layer of metal on the substrate 110, and etching on the first layer of metal by using one mask to obtain the first metal layer 120;

depositing on the first metal layer 120 to form a buffer deposit layer, and depositing on the buffer deposit layer to form an oxide film deposit layer; and forming the buffer layer 130 and the oxide film layer 140 by using one mask, where widths of the first metal layer 120, the buffer layer 130, and the oxide film layer 140 are equivalent, where "being equivalent" means that when a difference between widths of two layers is within a preset threshold, it can be considered that the widths of the two layers are equivalent, but in fact, a layer located underneath is slightly larger than a layer located on top.

In fact, due to etching, the buffer layer 130 is slightly larger than the oxide film layer 140, and the first metal layer 120 is slightly larger than the buffer layer 130. All these are normal; or even, the buffer layer 130 may also be designed to be larger than the oxide film layer 140 and the first metal layer 120 larger than the buffer layer 130.

In this solution, the widths of the first metal layer 120, the buffer layer 130, and the oxide film layer 140 are equivalent, to facilitate etching in a processing process.

Figure 4:
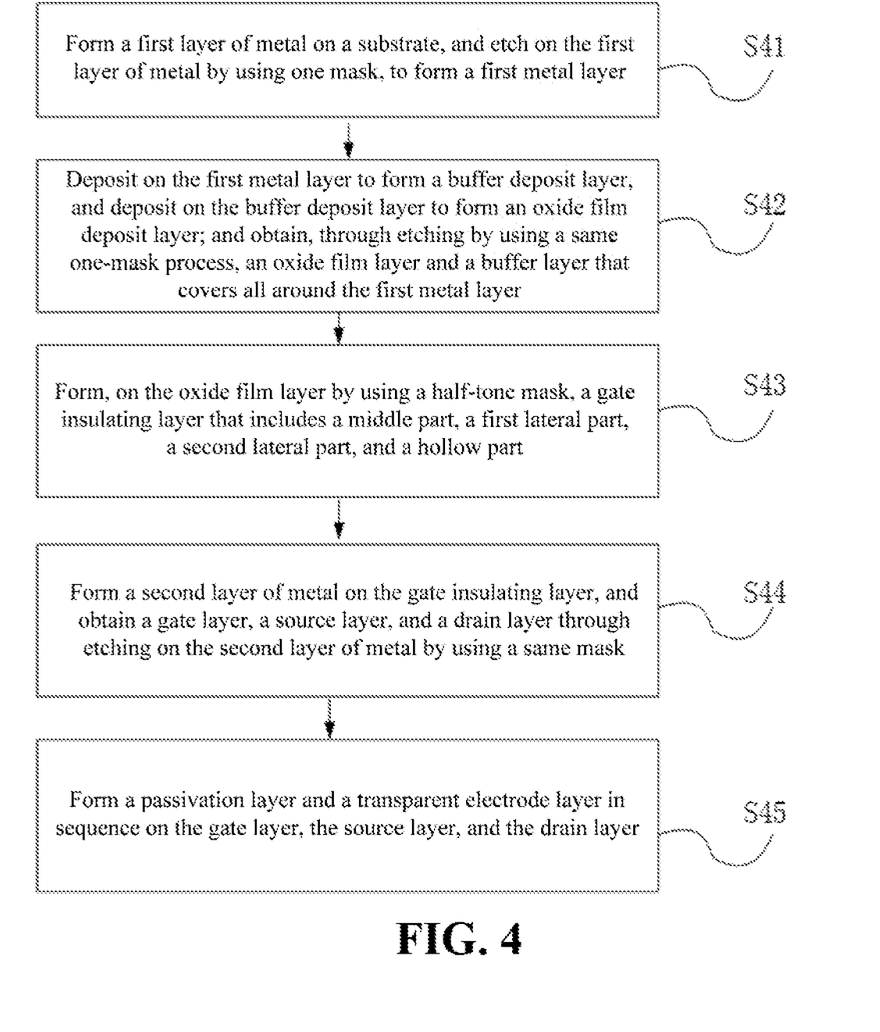
FIG. 4 is a schematic flowchart of a display panel preparation method according to an embodiment of the present application.

In another embodiment of the present application, as shown in FIG. 2a to FIG. 2f and FIG. 4, a display panel preparation method is disclosed and includes the following steps:

S41: Forming a first layer of metal on a substrate 110, and etch on the first layer of metal by using one mask, to form a first metal layer 120;

S42: Depositing on the first metal layer 120 to form a buffer deposit layer, and deposit on the buffer deposit layer to form an oxide film deposit layer; and etch on the buffer deposit layer and the oxide film deposit layer by using a same mask process, to obtain an oxide film layer 140 and a buffer layer 130 that covers all around the first metal layer 120;

S43: Forming, on the oxide film layer 140 by using a half-tone mask, a gate insulating layer 150 that includes a middle part 151, a first lateral part 152, a second lateral part 153, and a hollow part, where a thickness of the middle part 151 of the gate insulating layer 150 is higher than thicknesses of the first lateral part 152 and the second lateral part 153, and the hollow part is separately formed between the middle part 151 and the first lateral part 152 and between the middle part 151 and the second lateral part 153;

S44: Forming a second layer of metal on the gate insulating layer 150; and etch on the second layer of metal by using a same mask process, to obtain a gate layer 161 that is located on the middle part 151 of the gate insulating layer 150, and obtain the source layer 162 that is located on the first lateral part 152 of the gate insulating layer 150 and the drain layer 163 that is located on the second lateral part 153, where the formed source layer 162 and drain layer 163 are insulated from the gate layer 161, and the gate layer 161 is located on the middle part 151, and a width of the gate layer 161 is less than a width of the middle part 151;

S45: Forming a passivation layer 170 and a transparent electrode layer 180 in sequence on the gate layer 161, the source layer 162, and the drain layer 163.

In this solution, a self-aligned top gate structure is improved, and the gate insulating layer 150 is formed by using the half-tone mask, where the middle part is higher than the two lateral parts and the hollow part is separately formed between the middle part 151 and the two lateral parts. In this case, a layer of metal with which the gate insulating layer 150 is coated through sputtering is the second layer of metal; and the gate layer 161, the source layer 162, and the drain layer 163 can be formed at a same time through etching by using a same mask process. In this way, one mask is reduced, that is, seven masks are changed to six masks, thereby saving time of an exposing and developing process and achieving the purpose of reducing costs and improving a capacity. In addition, the source layer 162 and the drain layer 163 are formed together with the gate layer 161; and disposition of a segment gap structure and the hollow part can prevent a short circuit, ensure insulation, and ensure switching performance of a TFT.

Figure 2F:
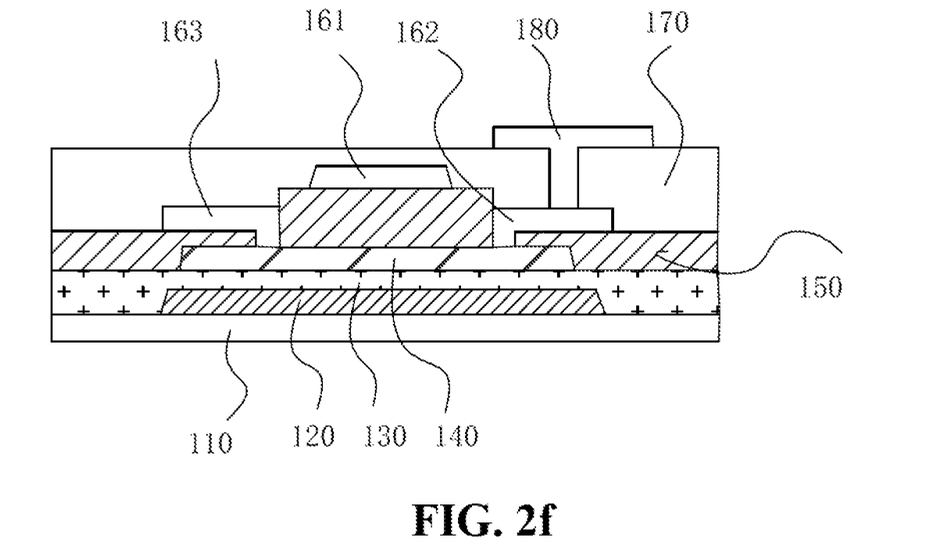

In another embodiment of the present application, as shown in FIG. 2a to FIG. 2f, a display panel 100 is disclosed, including:

a first substrate 110, where a first metal layer 120, a buffer layer 130, and an oxide film layer 140 are disposed on the first substrate 110 in sequence;

a gate insulating layer 150, located on the oxide film layer 140;

a gate layer 161, formed on a middle part 151 of the gate insulating layer 150;

a source layer 162 and a drain layer 163, formed on the gate insulating layer 150 and located on two sides of the gate layer 161; and a passivation layer 170 and a transparent electrode layer 180, formed in sequence on the gate layer 161, the source layer 162, and the drain layer 163, where the source layer 162 and the drain layer 163 are insulated from the gate layer 161, and the source layer 162 and the drain layer 163 are connected by using the oxide film layer 140, and the gate layer 161, the source layer 162, and the drain layer 163 are formed by using a same mask process.

In this solution, a self-aligned top gate structure is improved. A layer of metal with which the gate insulating layer 150 is coated through sputtering is a second layer of metal, and the gate layer 161, the source layer 162, and the drain layer 163 can be formed at a same time through etching by using a same mask process. The gate layer 161, the source layer 162, and the drain layer 163 can be completed at a same time on a structure of the gate insulating layer 150 that is formed by using a half-tone mask. In this way, one mask is reduced, that is, seven masks are changed to six masks, thereby saving time of an exposing and developing process and achieving the purpose of reducing costs and improving a capacity.

In an embodiment, the gate insulating layer 150 includes the middle part 151, a first lateral part 152, and a second lateral part 153, where a thickness of the middle part 151 is greater than thicknesses of the first lateral part 152 and the second lateral part 153;

the gate insulating layer 150 further includes a first hollow part 154 that is formed between the middle part 151 and the first lateral part 152 and a second hollow part 155 that is formed between the middle part 151 and the second lateral part 153;

the gate layer 161 is formed on the middle part 151;

the source layer 162 is formed on the first lateral part 152 and is connected to the oxide film layer 140 by using the first hollow part 154;

the drain layer 163 is formed on the second lateral part 153 and is connected to the oxide film layer 140 by using the second hollow part 155; and the gate layer 161, the source layer 162, and the drain layer 163 are formed by using a same metal layer by using a same mask process.

In this solution, before the source layer 162, the gate layer 161, and the drain layer 163 are formed, the gate insulating layer 150 includes the middle part 151, the first lateral part 152, and the second lateral part 153. The thickness of the middle part 151 of the gate insulating layer 150 is higher than the thicknesses of the first lateral part 152 and the second lateral part 153. In this way, a segment gap exists between the middle part 151 of the gate insulating layer 150 and the first lateral part 152 and between the middle part 151 of the gate insulating layer 150 and the second lateral part 153, thereby avoiding a short circuit. In addition, the hollow part is separately formed between the middle part 151 and the first lateral part 152 and between the middle part 151 and the second lateral part 153. Disposition of the hollow part can avoid a short circuit, ensure insulation, and ensure switching performance of a thin film transistor.

In an embodiment, the gate layer 161 is located on the middle part 151, and a width of the gate layer 161 is less than a width of the middle part 151.

In this solution, the gate layer 161 is located on the middle part 151 of the gate insulating layer 150, and the width of the gate layer 161 is less than the width of the middle part 151 of the gate insulating layer 150. The source layer 162 and the drain layer 163 are respectively located on the two lateral parts of the gate insulating layer 150. This can reduce parasitic capacitance generated between the gate layer 161 and the drain layer 163 and reduce parasitic capacitance generated between the gate layer 161 and the source layer 162.

In an embodiment, two sides of the first metal layer 120 are hollowed, and the buffer layer 130 covers an upper surface of the first metal layer 120 and hollowed parts on the two sides.

The buffer layer 130 is formed on the first metal layer 120, and the buffer layer 130 covers all around the first metal layer 120. Compared to a situation in which the buffer layer 130 does not cover the first metal layer 120 completely, the buffer layer 130 covering all around the first metal layer 120 can have a better insulation effect.

The panel in the present application may be a TN (full spelling: Twisted Nematic, that is, twisted nematic) panel, an IPS (fan-Plane Switching, in-plane switching) panel, or a VA (Multi-domain Vertical Alignment, multi-domain vertical alignment) panel. Certainly, the panel in the present application may be a panel of another type, provided that it is applicable.

The foregoing contents are further detailed descriptions of the present application in combination with specific implementations, and it cannot be construed that specific implementations of the present application are only restricted to these descriptions. A person with ordinary skills in the art of the present application may still make several simple deductions or replacements without departing from the concepts of the present application. All such deductions and replacements shall be considered to fall within the protection scope of the present application.

What is claimed is:

1. A display panel preparation method, comprising:
   forming a first metal layer, a buffer layer, and an oxide film layer on a substrate in sequence;
   forming a gate insulating layer on the oxide film layer by using a half-tone mask;
   forming a second layer of metal on the gate insulating layer, and etching the second layer of metal by using a same mask process, to obtain a gate layer, and a source layer and a drain layer that are coupled to each other through the oxide film layer; and
   forming a passivation layer and a transparent electrode layer in sequence on the gate layer, the source layer, and the drain layer.

2. The display panel preparation method according to claim 1, wherein the operations of forming a gate insulating layer on the oxide film layer by using a half-tone mask, and forming a second layer of metal on the gate insulating layer, and etching the second layer of metal by using a same mask process, to obtain a gate layer, and a source layer and a drain layer that are coupled to each other through the oxide film layer comprise:

forming, on the oxide film layer by using the half-tone mask, a gate insulating layer that comprises a middle portion, a first side portion, a second side portion, and a hollow portion defined between the middle portion and the first side portion and between the middle portion and the second side portion, wherein a height of the middle portion is higher than a height of each of the first side portion and the second side portion;

forming the second metal layer on the gate insulating layer; and etching the second metal layer by using a same mask process, to obtain the gate layer that is disposed on the middle portion of the gate insulating layer, and obtain the source layer that is disposed on the first side portion of the gate insulating layer, and the drain layer that is disposed on the second side portion, wherein the formed source layer and drain layer are insulated from the gate layer.

3. The display panel preparation method according to claim 2, wherein in the operation of etching the second metal layer by using a same mask process, to obtain the gate layer that is disposed on the middle portion of the gate insulating layer, the gate layer is disposed on the middle portion, and a width of the gate layer is less than a width of the middle portion.

4. The display panel preparation method according to claim 2, wherein a top surface of each of the source layer and the drain layer is lower than a top surface of the middle portion of the gate insulating layer.

5. The display panel preparation method according to claim 2, wherein an upper surface of each of the source layer and the drain layer is a flat plane.

6. The display panel preparation method according to claim 1, wherein the operation of forming a first metal layer, a buffer layer, and an oxide film layer on a substrate in sequence comprises:

forming a first layer of metal on the substrate, and etching the first layer of metal by using one mask, to form the first metal layer;

depositing on the first metal layer to form a buffer deposit layer, and depositing on the buffer deposit layer to form an oxide film deposit layer; and etching the buffer deposit layer and the oxide film deposit layer by using a same mask process, to obtain the oxide film layer and the buffer layer that covers all around the first metal layer.

7. The display panel preparation method according to claim 1, wherein the operation of forming a first metal layer, a buffer layer, and an oxide film layer on a substrate in sequence comprises:

obtaining a first layer of metal on the substrate, and etching the first layer of metal using one same mask to obtain the first metal layer;

depositing on the first metal layer to form a buffer deposit layer, and depositing on the buffer layer buffer deposit layer to form an oxide film deposit layer; and forming the buffer layer and the oxide film layer by using one same mask, wherein widths of the first metal layer, the buffer layer, and the oxide film layer are substantially equal to each other.

8. The display panel preparation method according to claim 6, wherein a width of the buffer layer is greater than a width of the oxide film layer.

9. The display panel preparation method according to claim 6, wherein a width of the first metal layer is greater than a width of the buffer layer.

10. The display panel preparation method according to claim 1, wherein the substrate is a glass substrate.

11. A display panel preparation method, comprising:

forming a first layer of metal on a substrate, and etching the first layer of metal by using one same mask, to form a first metal layer;

depositing on the first metal layer to form a buffer deposit layer, and depositing on the buffer deposit layer to form an oxide film deposit layer;

etching the buffer deposit layer and the oxide film deposit layer by using a same mask process, to obtain an oxide film layer and a buffer layer that covers all around the first metal layer;

forming, on the oxide film layer by using a half-tone mask, a gate insulating layer that comprises a middle portion, a first side portion, a second side portion, and a hollow portion defined between the middle portion and the first side portion and between the middle portion and the second side portion, wherein a height of the middle portion of the gate insulating layer is higher than height of the first side portion and the second side portion;

forming a second layer of metal on the gate insulating layer;

etching the second layer of metal by using a same mask process, to obtain a gate layer that is disposed on the middle portion of the gate insulating layer, and obtain a source layer that is disposed on the first side portion of the gate insulating layer and a drain layer that is disposed on the second side portion, wherein the formed source layer and drain layer are insulated from the gate layer, and the gate layer is disposed on the middle portion, and a width of the gate layer is less than a width of the middle portion; and forming a passivation layer and a transparent electrode layer in sequence on the gate layer, the source layer, and the drain layer.

12. A display panel, comprising:

a first substrate, wherein a first metal layer, a buffer layer, and an oxide film layer are disposed on the first substrate in sequence;

a gate insulating layer, disposed on the oxide film layer, wherein the gate insulating layer is formed using a half-tone mask;

a gate layer, formed on a middle portion of the gate insulating layer;

a source layer and a drain layer, formed on the gate insulating layer and disposed on two sides of the gate layer; and a passivation layer and a transparent electrode layer, formed in sequence on the gate layer, the source layer, and the drain layer, wherein the source layer and the drain layer are insulated from the gate layer, and the source layer and the drain layer are connected by using the oxide film layer, and the gate layer, the source layer, and the drain layer are formed by using a same mask process.

13. The display panel according to claim 12, wherein the first substrate is a glass substrate.

14. The display panel according to claim 12, wherein a width of the buffer layer is greater than a width of the oxide film layer.

15. The display panel according to claim 12, wherein a width of the first metal layer is greater than a width of the buffer layer.

16. The display panel according to claim 12, wherein the gate insulating layer comprises the middle portion, a first side portion, and a second side portion, wherein a height of the middle portion is greater than a height of each of the first side portion and the second side portion;

the gate insulating layer further comprises a first hollow portion that is formed between the middle portion and the first side portion and a second hollow portion that is formed between the middle portion and the second side portion;

the gate layer is formed on the middle portion;

the source layer is formed on the first side portion and is coupled to the oxide film layer through the first hollow portion;

the drain layer is formed on the second side portion and is coupled to the oxide film layer through the second hollow portion; and wherein the gate layer, the source layer, and the drain layer are formed by using a same metal layer by using a same mask process.

17. The display panel according to claim 16, wherein the gate layer is located on the middle portion, and a width of the gate layer is less than a width of the middle portion.

18. The display panel according to claim 12, wherein two sides of the first metal layer are hollowed out, and the buffer layer covers an upper surface of the first metal layer and hollowed parts on the two sides.

19. The display panel according to claim 12, wherein the display panel is one of a twisted nematic display panel, an in-plane switching display panel, or a multi-domain vertical alignment display panel.

\* \* \* \* \*